(12) United States Patent
Hu et al.

(10) Patent No.: US 9,897,281 B2
(45) Date of Patent: Feb. 20, 2018

(54) OPTICAL MODULE AND LIGHT SOURCE

(71) Applicant: Young Lighting Technology Inc., Hsin-Chu (TW)

(72) Inventors: Chih-Ming Hu, Hsin-Chu (TW); Shih-Yi Lin, Hsin-Chu (TW); Ching-Kuo Yeh, Hsin-Chu (TW)

(73) Assignee: Young Lighting Technology Inc., Hsin-Chu (TW)

( * ) Notice: Subject to any disclaimer, the term of this patent is extended or adjusted under 35 U.S.C. 154(b) by 128 days.

(21) Appl. No.: 15/181,419

(22) Filed: Jun. 14, 2016

(65) Prior Publication Data
US 2017/0146216 A1    May 25, 2017

(30) Foreign Application Priority Data

Nov. 24, 2015 (CN) .......................... 2015 1 0824133

(51) Int. Cl.
| | |
|---|---|
| *F21V 11/00* | (2015.01) |
| *F21V 7/00* | (2006.01) |
| *F21V 5/00* | (2018.01) |
| *F21V 9/00* | (2018.01) |
| *G02B 6/00* | (2006.01) |
| *F21V 31/04* | (2006.01) |
| *H01L 25/075* | (2006.01) |
| *H01L 33/50* | (2010.01) |

(Continued)

(52) U.S. Cl.
CPC ............ *F21V 7/0091* (2013.01); *F21V 5/002* (2013.01); *F21V 9/00* (2013.01); *G02B 6/00* (2013.01); *F21V 31/04* (2013.01); *F21Y 2115/10* (2016.08); *H01L 25/0753* (2013.01); *H01L 33/50* (2013.01); *H01L 33/58* (2013.01)

(58) Field of Classification Search
CPC ... F21K 9/00; F21K 2/00; F21V 31/04; F21V 5/002; F21V 7/0091; F21V 14/00; F21Y 2115/10; G02B 6/00; H01L 25/0753; H01L 33/50; H01L 33/58
See application file for complete search history.

(56) References Cited

U.S. PATENT DOCUMENTS

| | | | |
|---|---|---|---|
| 2006/0239037 A1* | 10/2006 | Repetto | F21K 9/00 362/555 |
| 2009/0256166 A1* | 10/2009 | Koike | H01L 33/501 257/98 |
| 2012/0080783 A1* | 4/2012 | Hsieh | H01L 23/3677 257/690 |

FOREIGN PATENT DOCUMENTS

CN          103872226         6/2014

* cited by examiner

*Primary Examiner* — Ali Alavi
(74) *Attorney, Agent, or Firm* — JCIPRNET

(57) ABSTRACT

An optical module and a light source are provided. The light source includes a circuit board, a plurality of light-emitting element chips, a plurality of total reflection elements, an encapsulant, and a plurality of optical wavelength conversion particles. The light-emitting element chips are disposed on the circuit board. Each of the light-emitting element chips is adapted to emit a light beam. The total reflection elements are disposed on the circuit board. Each of the total reflection elements is configured adjacent to one of the light-emitting element chips, a partial light beam of the light beam emitted by the one of the light-emitting element chips enters the total reflection element, and is transmitted in the total reflection element, and emits out from the total reflection element. The encapsulant covers the light-emitting element chips and the total reflection elements. The optical wavelength conversion particles are distributed in the encapsulant.

26 Claims, 4 Drawing Sheets

(51) Int. Cl.
*H01L 33/58* (2010.01)
*F21Y 115/10* (2016.01)

OPTICAL MODULE AND LIGHT SOURCE

CROSS-REFERENCE TO RELATED APPLICATION

This application claims the priority benefit of China application serial no. 201510824133.5, filed on Nov. 24, 2015. The entirety of the above-mentioned patent application is hereby incorporated by reference herein and made a part of this specification.

BACKGROUND OF THE INVENTION

Field of the Invention

The invention relates to an optical module and a light source, and particularly relates to an optical module and a light source having total reflection elements.

Description of Related Art

In recent years, since people pay more attention to environmental protection, light emitting elements used in an optical module have been gradually developed from cold cathode fluorescent lamps (CCFLs) to light-emitting diodes (LEDs) which are more environmental friendly.

Taking a side type optical module as an example, the LEDs are generally disposed at a side surface of a light guide plate (LGP), where the shortest distance between each of the LEDs and a valid illumination area of the LGP is A, and a pitch between any two adjacent LEDs is P. In order to provide a uniform planar light source, an optimal A/P ratio is generally determined according to a divergence angle of the LED. However, in order to cope with a design requirement of slim border, the shortest distance A between each of the LED and the valid illumination area has to be decreased. When the A/P ratio is too low, a place of the valid illumination area close to the light source may generate bright-dark alternated hot spots.

According to the existing technique, the hot spot issues are generally solved by decreasing the pitch P of the LEDs. However, when the pitch P is decreased, the quantity of the LEDs and working hours for wire bonding are accordingly increased, which causes increase of the manufacturing cost. Therefore, it is an important issue for technicians of the field to enhance uniformity of the planar light source of the optical module under a premise of not changing the pitch of the LEDs.

The information disclosed in the "BACKGROUND OF THE INVENTION" section is only for enhancement of understanding of the background of the described technology and therefore it may contain information that does not form the prior art that is already known to a person of ordinary skill in the art. Further, the information disclosed in the "BACKGROUND OF THE INVENTION" section does not mean that one or more problems to be resolved by one or more embodiments of the invention was acknowledged by a person of ordinary skill in the art.

SUMMARY OF THE INVENTION

The invention is directed to an optical module, which is adapted to provide a uniform planar light source under a premise of not changing a pitch of light-emitting diodes (LEDs).

The invention is directed to a light source, which is help for mitigating hot spots.

Other objects and advantages of the invention can be further illustrated by the technical features broadly embodied and described as follows.

In order to achieve one or a portion of or all of the objects or other objects, an embodiment of the invention provides an optical module including an optical plate and a light source. The optical plate has a light incident surface. The light source faces the light incident surface and includes a circuit board, a plurality of light-emitting element chips, a plurality of total reflection elements, an encapsulant, and a plurality of optical wavelength conversion particles. The light-emitting element chips are disposed on the circuit board. Each of the light-emitting element chips is adapted to emit a light beam. The total reflection elements are disposed on the circuit board, and each of the total reflection elements is configured adjacent to one of the light-emitting element chips, a partial light beam of the light beam emitted by the one of the light-emitting element chips enters the total reflection element, and the partial light beam is transmitted in the total reflection element in a total reflective manner, and emits out from the total reflection element. The encapsulant covers the light-emitting element chips and the total reflection elements. The optical wavelength conversion particles are distributed in the encapsulant.

In order to achieve one or a portion of or all of the objects or other objects, an embodiment of the invention provides a light source including a circuit board, a plurality of light-emitting element chips, a plurality of total reflection elements, an encapsulant, and a plurality of optical wavelength conversion particles. The light-emitting element chips are disposed on the circuit board. Each of the light-emitting element chips is adapted to emit a light beam. The total reflection elements are disposed on the circuit board, and each of the total reflection elements is configured adjacent to one of the light-emitting element chips, where a partial light beam of the light beam emitted by the one of the light-emitting element chips enters the total reflection element, and the partial light beam is transmitted in the total reflection element in a total reflective manner, and emits out from the total reflection element. The encapsulant covers the light-emitting element chips and the total reflection elements. The optical wavelength conversion particles are distributed in the encapsulant.

According to the above descriptions, the embodiments of the invention have at least one of following advantages or effects. The light source of the invention guides a partial light beam of the light beam emitted by each of the light-emitting element chips towards a direction away from the light-emitting element chip by using the total reflection elements, such that the light beams emitted from the light source are more divergent, and energy distribution along an arranging direction of the light-emitting element chips is more linear. Therefore, the light source of the invention avails mitigating hot spot issues, and the optical module using the light source may provide a uniform planar light source under a premise of not changing a pitch of the light-emitting element chips.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings

DESCRIPTION OF EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
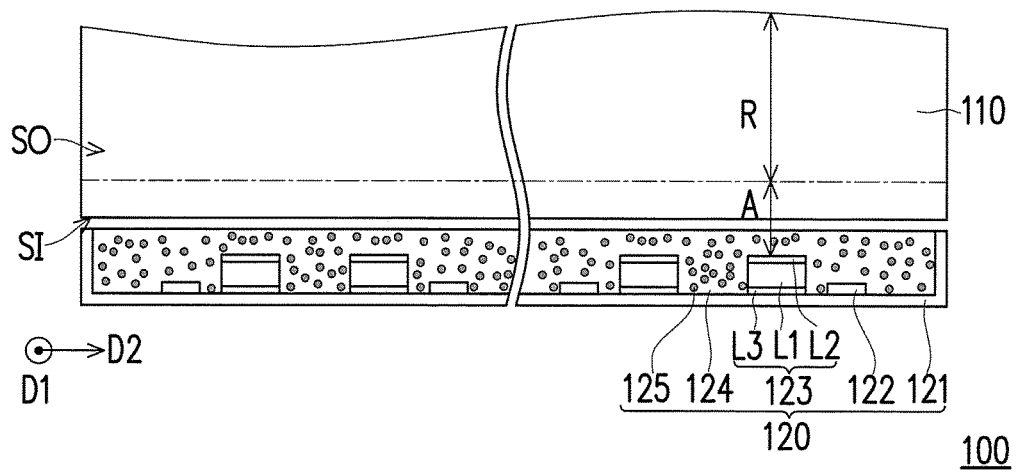
FIG. 1A is a partial top view of an optical module according to a first embodiment of the invention.
Figure 1B:
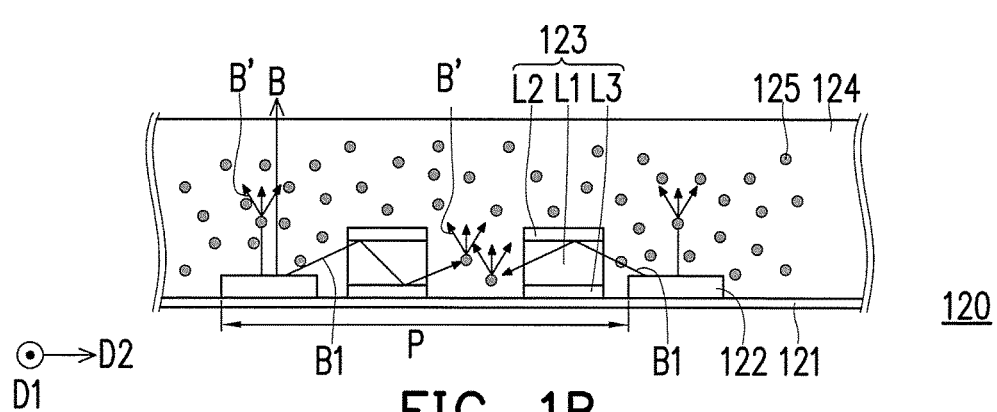
FIG. 1B is a partial enlarged view of a light source in FIG. 1A.

FIG. 1A is a partial top view of an optical module according to a first embodiment of the invention. FIG. 1B is a partial enlarged view of a light source in FIG. 1A. Referring to FIG. 1A and FIG. 1B, an optical module 100 includes an optical plate 110 and a light source 120. The optical module 100 can be a side type optical module or a direct type optical module. Taking the side type optical module as an example, the optical plate 110 is, for example, a light guide plate.

Specifically, the optical plate 110 has a light incident surface SI and a light emitting surface SO connected to the light incident surface SI. The light source 120 faces the light incident surface SI and is not overlapped with the light emitting surface SO. In detail, the light source 120 is disposed at the light incident surface SI of the optical plate 110, thereby the light source 120 and the light emitting surface SO are not overlapped along a direction D1 perpendicular to the light emitting surface SO.

After a light beam coming from the light source 120 enters the optical plate 110 through the light incident surface SI, the light beam is transmitted within the optical plate 110 in a total reflective manner. A plurality of microstructures can be formed on a bottom surface (which is not indicated, and is a surface opposite to the light emitting surface SO) of the optical plate 110 to spoil the total reflection, such that the light beam may emit from the light emitting surface SO. A refractive index of the optical plate 110 is, for example, between 1.4 and 1.5. For example, a material of the optical plate 110 can be glass or plastic. Taking the plastic as an example, the material of the optical plate 110 is, for example, polycarbonate (PC) or polymethylmethacrylate (PMMA), though the invention is not limited thereto.

The light source 120 includes a circuit board 121, a plurality of light-emitting element chips 122, a plurality of total reflection elements 123, an encapsulant 124, and a plurality of optical wavelength conversion particles 125. The light-emitting element chips 122 are disposed on the circuit board 121, and the light-emitting element chips 122 are, for example, arranged along a direction D2 parallel to the light incident surface SI, where the direction D2 is perpendicular to the direction D1. Each of the light-emitting element chips 122 is, for example, a light-emitting diode (LED) chip, and each of the light-emitting element chips 122 is adapted to emit a light beam B. The circuit board 121 is, for example, a printed circuit board, and circuits are formed on the circuit board 121 for transmitting driving signals to the light-emitting element chips 122. The total reflection elements 123 are disposed on the circuit board 121. Each of the total reflection elements 123 is configured adjacent to one of the light-emitting element chips 122. In the embodiment, two total reflection elements 123 are disposed between two adjacent light-emitting element chips 122, though the invention is not limited thereto. In other embodiments, only one total reflection element 123 or more than two total reflection elements 123 can be disposed between two adjacent light-emitting element chips 122. The encapsulant 124 covers the light-emitting element chips 122 and the total reflection elements 123. The encapsulant 124 is adapted to block water vapor and oxygen in the environment from influencing the sealed components. For example, a material of the encapsulant 124 includes epoxy or silicone, though the invention is not limited thereto. The optical wavelength conversion particles 125 are distributed in the encapsulant 124. The optical wavelength conversion particles 125 are adapted to absorb the light beam B, and emit an excited light beam B', and the optical wavelength conversion particles 125 can be phosphor powder or quantum dots.

Referring to FIG. 1B, the light beam B emitted by each of the light-emitting element chips 122 is transmitted to the light incident surface SI of FIG. 1A, where a partial light beam B1 of the light beam B may enter the total reflection element 123, and the partial light beam B1 is transmitted in the total reflection element 123 in the total reflective manner, and emits out from the total reflection element 123.

By using the total reflection element 123 to guide the partial light beam B1 of the light beam B emitted by each of the light-emitting element chips 122 towards a direction away from the light-emitting element chip 122 (i.e. the arranging direction of the light-emitting element chips 122, for example, the direction D2 and an opposite direction of the direction D2), the light beams (for example, a combination of the light beams B and the excited light beams B') emitted from the light source 120 can be more divergent in the arranging direction of the light-emitting element chips 122. In this way, energy distribution of the light beams emitted from the light source 120 along the arranging direction of the light-emitting element chips 122 can be more linear. Therefore, the light source 120 of the invention avails mitigating hot spot issues caused by excessive pitch P without changing the pitch P of the light-emitting element chips 122, and the optical module 100 may provide a uniform planar light source.

Moreover, since the light beams emitted by the light source 120 are more divergent along the arranging direction of the light-emitting element chips 122, the embodiment of the invention may effectively decrease the shortest distance A between each of the light-emitting element chips 122 and a valid illumination area R of the optical plate 110, such that the optical module 100 may satisfy a design requirement of slim border.

Since the longer a transmission path of the light beam B in the encapsulant 124 is, the more optical wavelength conversion particles 125 the light beam B contacts, the farther a region is away from the light-emitting element chip 122, the higher a proportion of converting the light beam B into the excited light beam B' is. In the embodiment, the light beam B is, for example, a blue light, and the excited light beam B' is, for example, a yellow light, and in the region away from the light-emitting element chip 122, the light beam emitted by the light source 120 is liable to be yellow-shifted due to that a proportion of the yellow light is higher than that of the blue light, and in a region close to the light-emitting element chip 122, the light beam emitted by the light source 120 is liable to be blue-shifted due to that the proportion of the blue light is higher than that of the yellow light. By using the total reflection elements 123 to transmit the partial light beams B1 of the light beams B, a proportion that the partial light beam B1 contacts the optical wavelength conversion particles 125 in the transmission path within the encapsulant 124 can be effectively decreased, so as to effectively mitigate a color shift phenomenon of the light source 120 along the arranging direction of the light-emitting element chips 122.

The total reflection element 123 can be any component suitable for transmitting the partial light beam B1 therein in the total reflective manner. For example, the total reflection element 123 may respectively include a first layer L1, a second layer L2 and a third layer L3, where the first layer L1 is located between the second layer L2 and the third layer L3, and the first layer L1 is located between the second layer L2 and the circuit board 121, and the third layer L3 is located between the first layer L1 and the circuit board 121. A refractive index of the first layer L1 is higher than refractive indexes of the second layer L2 and the third layer L3. Since the refractive index of the first layer L1 is higher than the refractive indexes of the second layer L2 and the third layer L3, the partial light beam B1 can be continuously total-reflected and transmitted at a boundary of the first layer L1 and the second layer L2 or a boundary of the first layer L1 and the third layer L3, i.e. based on a phenomenon that light beam is reflected back to an optically denser medium (i.e. the total reflection phenomenon) when the light beam is transmitted to an optically thinner medium (with a lower refractive index) from the optically denser medium (with a higher refractive index), the hot spot issue of the light source caused by excessive pitch can be mitigated without changing the pitch of the light-emitting element chips, and the optical module may provide a uniform planar light source.

Figure 2:
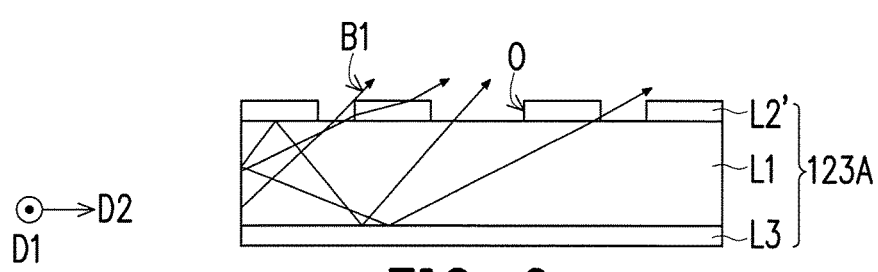
FIG. 2 and FIG. 3 are respectively top views of other implementations of a total reflection element in FIG. 1A.
Figure 3:
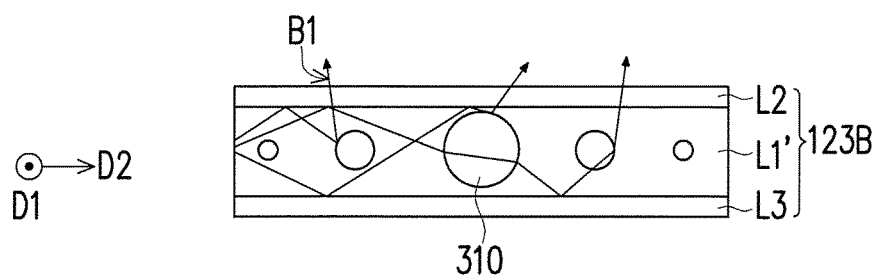

In the embodiment, a shape of an orthogonal projection (along the direction D2) of each of the total reflection elements 123 on the circuit board 121 is, for example, a block, and the second layer L2 completely covers the first layer L1, though the invention is not limited thereto. FIG. 2 and FIG. 3 are respectively top views of other implementations of the total reflection element in FIG. 1A, in which the same or similar components are denoted by the same or similar referential numbers, and details thereof are not repeated. Referring to FIG. 2, each of the total reflection elements 123A may extend along the arranging direction (for example, the direction D2) of the light-emitting element chips 122, such that a shape of the orthogonal projection (along the direction D2) of each of the total reflection elements 123A on the circuit board 121 (referring to FIG. 1B) is, for example, a bar. Moreover, the second layer L2' may have at least one opening O, and the partial light beam B1 of the light beam B (referring to FIG. 1B) emits out from the opening O. The more quantity the openings O have or the larger the size thereof is, the more the partial light beam B1 emit out from the total reflection elements 123A is. In this way, the energy distribution of the light beams emitted from the light source along the arranging direction of the light-emitting element chips can be more linear. Therefore, the light source of the invention avails mitigating the hot spot issues caused by excessive pitch without changing the pitch of the light-emitting element chips, and the optical module may provide a uniform planar light source. The quantity and the size of the openings O can be modified according to an actual design requirement, which are not limited to the implementation shown in FIG. 2.

Referring to FIG. 3, the first layer L1' of each of the total reflection elements 123B may have a plurality of bubbles 310 therein to spoil the total reflection, such that the partial light beam B1 may emit out from the total reflection element 123B. In this case, the second layer L2 can also be replaced by the second layer L2' of FIG. 2. Moreover, the bubbles 310 of the first layer L1' can be replaced by diffusion particles. Alternatively, the first layer L1' may include the bubbles 310 and the diffusion particles. The larger the density or the size of the bubbles 310 or the diffusion particles is, the more the emitted partial light beam B1 is. In this way, the energy distribution of the light beams emitted from the light source along the arranging direction of the light-emitting element chips can be more linear. Therefore, the light source of the invention avails mitigating the hot spot issues caused by excessive pitch without changing the pitch of the light-emitting element chips, and the optical module may provide a uniform planar light source. The density and the size of the bubbles 310 or the diffusion particles can be modified according to an actual design requirement, which are not limited to the implementation shown in FIG. 3.

Figure 4:
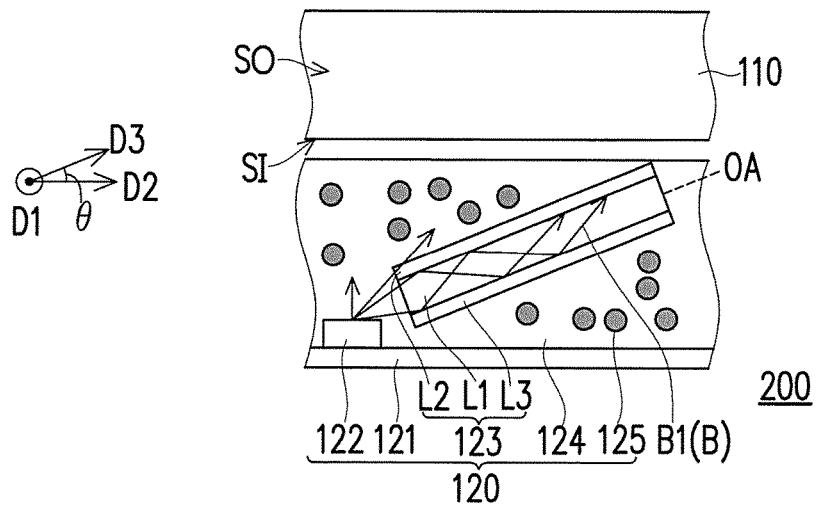
FIG. 4 to FIG. 9 are partial top views of optical modules according to a second embodiment to a seventh embodiment of the invention.

FIG. 4 to FIG. 9 are respectively partial top views of optical modules according to a second embodiment to a seventh embodiment of the invention, in which the same or similar components are denoted by the same or similar referential numbers, and details thereof are not repeated. Referring to FIG. 4 and FIG. 1A, a main difference between the optical module 200 and the optical module 100 is that an axial direction D3 of the total reflection element 123 and the circuit board 121 have an included angle therebetween (i.e. an included angle θ between the axial direction D3 and the direction D2), where the axial direction D3 is a direction parallel to an optical axis OA of the total reflection element 123. By rotating the total reflection element 123 (i.e. by modulating the included angle θ), the light energy received by the total reflection element 123 can be modulated. Therefore, by rotating the total reflection element 123 to a proper angle, the light energy received by the total reflection element 123 can be increased, such that more light beams are guided towards the direction away from the light-emitting element chip 122. In this way, the light beams emitted by the light source 120 are more divergent, and the energy distribution of the light beams along the arranging direction of the light-emitting element chips 122 can be more linear. It should be noted that the included angle θ can be adjusted according to an actual design requirement, which is not limited to the implementation shown in FIG. 4. Moreover, under the configuration of FIG. 4, the light source 120 may further include a fixing member (not shown) for fixing the total reflection element 123.

Figure 5:
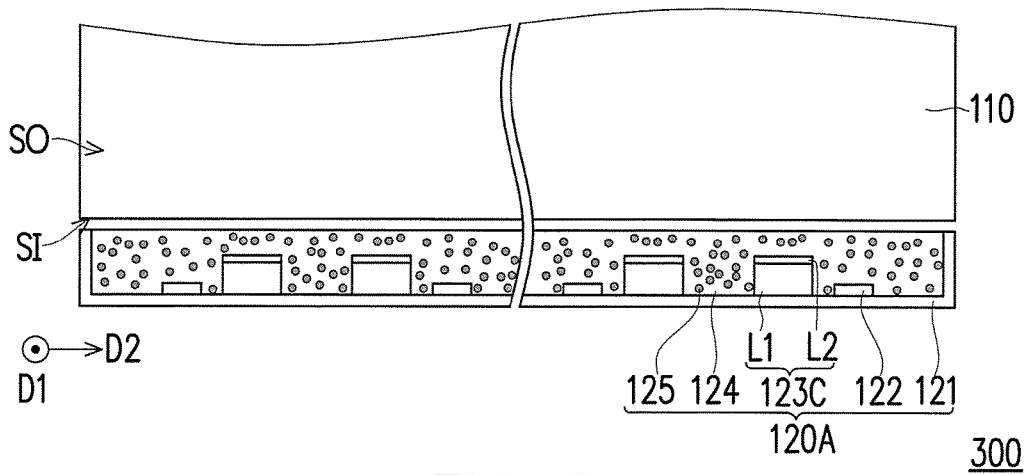

Referring to FIG. 5 and FIG. 1A, a main difference between the optical module 300 and the optical module 100 is that the total reflection elements 123C of the light source 120A respectively include a first layer L1 and a second layer L2. In detail, since the circuit board 121 itself may reflect light beam, the circuit board 121 is adopted to reflect the light beams transmitted backward (i.e. transmitted towards a direction away from the light guide plate 110) back to the first layer L1, so as to omit the third layer L3.

Figure 6:
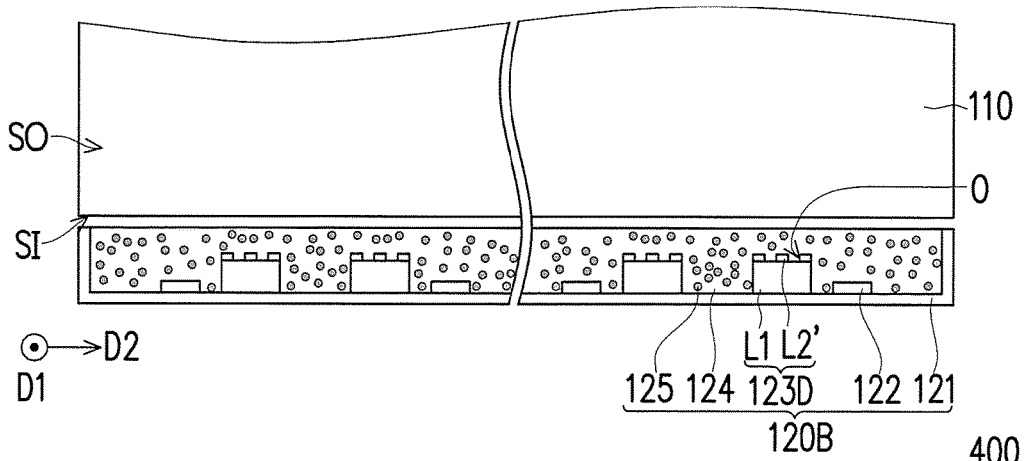

Referring to FIG. 6 and FIG. 5, a main difference between the optical module 400 and the optical module 300 is that the total reflection elements 123D of the light source 120B adopt the second layer L2' of FIG. 2 to replace the second layer L2 of FIG. 5.

Figure 7:
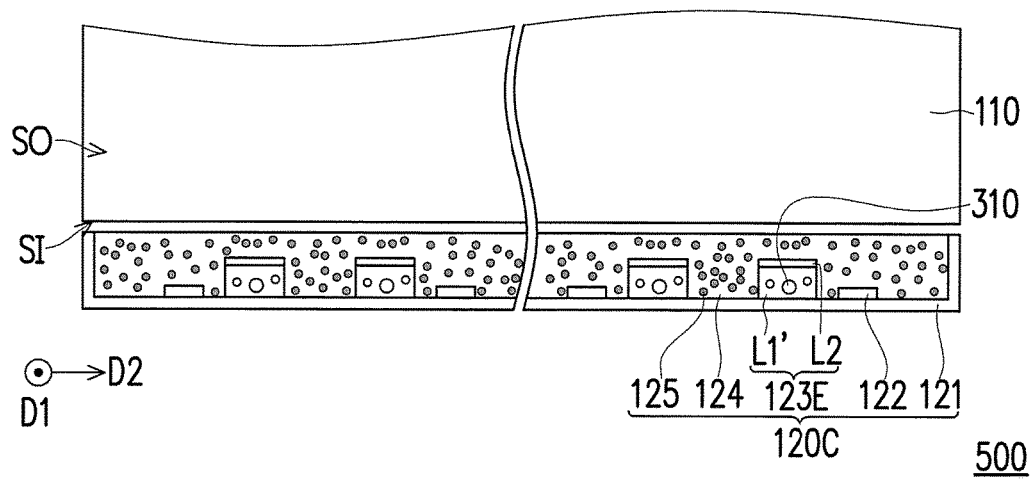

Referring to FIG. 7 and FIG. 5, a main difference between the optical module 500 and the optical module 300 is that the total reflection elements 123E of the light source 120C adopt the first layer L1' of FIG. 3 to replace the first layer L1 of FIG. 5.

Figure 8:
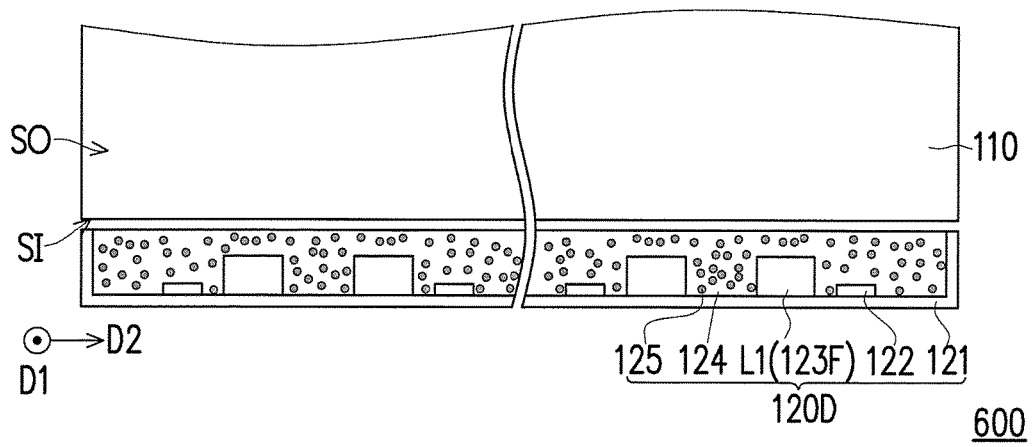

Referring to FIG. 8 and FIG. 5, a main difference between the optical module 600 and the optical module 300 is that the total reflection elements 123F of the light source 120D are respectively single layer transparent structures, and each of the total reflection elements 123F, for example, only includes the first layer L1. Moreover, based on the phenomenon that light beam is reflected back to an optically denser medium (i.e. the total reflection phenomenon) when the light beam is transmitted to an optically thinner medium (with a lower refractive index) from the optically denser medium (with a higher refractive index), in the embodiment, a refractive index of each single layer transparent structure (the first layer L1) is higher than a refractive index of the encapsulant 124, such that the partial light beam B1 of the light beam B in FIG. 1B can be transmitted in the total reflection element 123F in the total reflective manner. In this way, the second layer L2 and the third layer L3 can be omitted.

Figure 9:
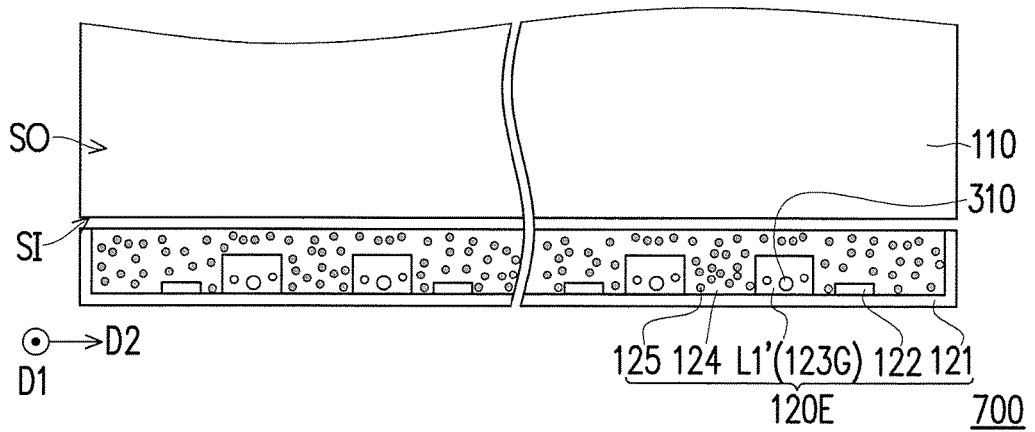

Referring to FIG. 9 and FIG. 8, a main difference between the optical module 700 and the optical module 600 is that each of the total reflection elements 123G of the light source 120E only includes the first layer L1' of FIG. 3.

Figure 10:
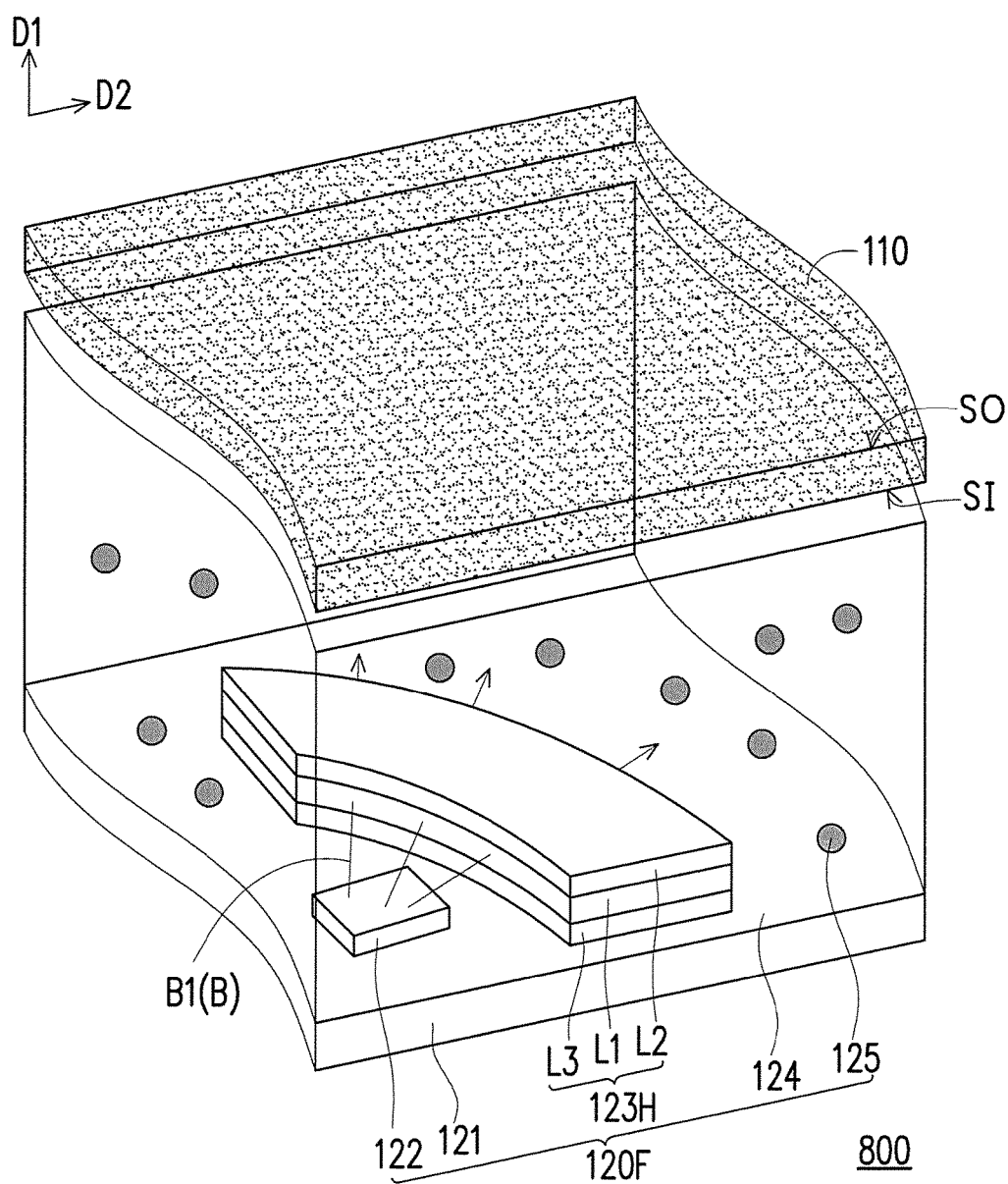
FIG. 10 is a partial three-dimensional view of an optical module according to an eighth embodiment of the invention.

FIG. 10 is a partial three-dimensional view of an optical module according to an eighth embodiment of the invention, in which the same or similar components are denoted by the same or similar referential numbers, and details thereof are not repeated. Referring to FIG. 10 and FIG. 1A, a main difference between the optical module 800 and the optical module 100 is that the optical module 800 is a direct type optical module, and the optical plate 110 is, for example, a diffusion plate. Specifically, the optical plate 110 has a light incident surface SI and a light emitting surface SO opposite to the light incident surface SI. The light source 120F faces the light incident surface SI and is overlapped with the light emitting surface SO. In detail, the light source 120F is disposed under the optical plate 110, so that the light source 120F is overlapped with the light emitting surface SO along the direction D1 perpendicular to the light emitting surface SO. The diffusion plate (the optical plate 110) is adapted to improve light uniformity of the planar light source emitted from the optical module 800. For example, a material of the diffusion plate can be plastic, such as polystyrene (PS), polycarbonate (PC) or polymethylmethacrylate (PMMA), though the invention is not limited thereto.

In the embodiment, a shape of an orthogonal projection of each of the total reflection elements 123H on the circuit board 121 is an arc, though the invention is not limited thereto. In another embodiment, the shape of the orthogonal projection of each of the total reflection elements 123H on the circuit board 121 can be a ring. For example, each of the total reflection elements 123H may respectively surround one of the light-emitting element chips 122. Alternatively, a curving degree of each of the total reflection elements 123H and a range for each of the total reflection elements 123H surrounding the corresponding light-emitting element chip 122 can be changed according to an actual requirement.

In summary, the embodiments of the invention have at least one of following advantages or effects. The light source of the invention guides the partial light beam of the light beam emitted by each of the light-emitting element chips towards a direction away from the light-emitting element chip by using the total reflection elements, such that the light beams emitted from the light source are more divergent, and energy distribution along an arranging direction of the light-emitting element chips is more linear. Therefore, the light source of the invention avails mitigating the hot spot issues, and the optical module using the light source may provide a uniform planar light source under a premise of not changing a pitch of the light-emitting element chips.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An optical module, comprising:
   an optical plate, having a light incident surface; and
   a light source, facing the light incident surface, and comprising:
      a circuit board;
      a plurality of light-emitting element chips, disposed on the circuit board, and each of the light-emitting element chips being adapted to emit a light beam;
      a plurality of total reflection elements, disposed on the circuit board, and each of the total reflection elements being configured adjacent to one of the light-emitting element chips. wherein a partial light beam of the light beam emitted by the one of the light-emitting element chips enters the total reflection element, and the partial light beam is transmitted in the total reflection element in a total reflective manner, and emits out from the total reflection element;
      an encapsulant, covering the light-emitting element chips and the total reflection elements; and
      a plurality of optical wavelength conversion particles, distributed in the encapsulant.

2. The optical module as claimed in claim 1, wherein the optical plate further has a light emitting surface, the light emitting surface is connected to the light incident surface, and the light source is not overlapped with the light emitting surface.

3. The optical module as claimed in claim 1, wherein the optical plate further has a light emitting surface, the light emitting surface is opposite to the light incident surface, and the light source is overlapped with the light emitting surface.

4. The optical module as claimed in claim 1, wherein each of the light-emitting element chips is a light-emitting diode (LED) chip.

5. The optical module as claimed in claim 1, wherein the total reflection elements are respectively a single layer transparent structure, and a refractive index of each single layer transparent structure is higher than a refractive index of the encapsulant.

6. The optical module as claimed in claim 5, wherein each of the single layer transparent structures has at least one of a plurality of bubbles and a plurality of diffusion particles therein.

7. The optical module as claimed in claim 1, wherein the total reflection elements respectively comprise a first layer and a second layer, the first layer is located between the second layer and the circuit board, and a refractive index of the first layer is higher than a refractive index of the second layer.

8. The optical module as claimed in claim 7, wherein the first layer has at least one of a plurality of bubbles and a plurality of diffusion particles therein.

9. The optical module as claimed in claim 7, wherein the second layer has at least one opening, and the partial light beam emits out from the at least one opening.

10. The optical module as claimed in claim 7, wherein the total reflection elements respectively further comprise a third layer, the third layer is located between the first layer and the circuit board, and the refractive index of the first layer is higher than a refractive index of the third layer.

11. The optical module as claimed in claim 1, wherein two or more total reflection elements are disposed between two adjacent light-emitting element chips.

12. The optical module as claimed in claim 1, wherein a shape of an orthogonal projection of each of the total reflection elements on the circuit board is a block, a bar, an arc or a ring.

13. The optical module as claimed in claim 1, wherein an axial direction of the total reflection elements and the circuit board have an included angle therebetween.

14. A light source, comprising:
   a circuit board;
   a plurality of light-emitting element chips, disposed on the circuit board, and each of the light-emitting element chips being adapted to emit a light beam;
   a plurality of total reflection elements, disposed on the circuit board, and each of the total reflection elements being configured adjacent to one of the light-emitting element chips, wherein a partial light beam of the light beam emitted by the one of the light-emitting element chips enters the total reflection element, and the partial light beam is transmitted in the total reflection element in a total reflective manner, and emits out from the total reflection element;
   an encapsulant, covering the light-emitting element chips and the total reflection elements; and
   a plurality of optical wavelength conversion particles, distributed in the encapsulant.

15. The light source as claimed in claim 14, wherein each of the light-emitting element chips is a light-emitting diode (LED) chip.

16. The light source as claimed in claim 14, wherein the total reflection elements are respectively a single layer transparent structure, and a refractive index of each single layer transparent structure is higher than a refractive index of the encapsulant.

17. The light source as claimed in claim 16, wherein each of the single layer transparent structures has at least one of a plurality of bubbles and a plurality of diffusion particles therein.

18. The light source as claimed in claim 14, wherein the total reflection elements respectively comprise a first layer and a second layer, the first layer is located between the second layer and the circuit board, and a refractive index of the first layer is higher than a refractive index of the second layer.

19. The light source as claimed in claim 18, wherein the first layer has at least one of a plurality of bubbles and a plurality of diffusion particles therein.

20. The light source as claimed in claim 18, wherein the second layer has at least one opening, and the partial light beam emits out from the at least one opening.

21. The light source as claimed in claim 18, wherein the total reflection elements respectively further comprise a third layer, the third layer is located between the first layer and the circuit board, and the refractive index of the first layer is higher than a refractive index of the third layer.

22. The light source as claimed in claim 14, wherein two or more total reflection elements are disposed between two adjacent light-emitting element chips.

23. The light source as claimed in claim 14, wherein a shape of an orthogonal projection of each of the total reflection elements on the circuit board is a block, a bar, an arc or a ring.

24. The light source as claimed in claim 14, wherein an axial direction of the total reflection elements and the circuit board have an included angle therebetween.

25. The light source as claimed in claim 14, wherein a material of the encapsulant comprises epoxy or silicone.

26. The light source as claimed in claim 14, wherein the optical wavelength conversion particles are phosphor powder or quantum dots.

* * * * *